US011767588B2

(12) United States Patent
Lee (10) Patent No.: US 11,767,588 B2
(45) Date of Patent: Sep. 26, 2023

(54) SUBSTRATE FIXING DEVICE, DEPOSITION PROCESSING EQUIPMENT INCLUDING THE SAME, AND DEPOSITION PROCESSING METHOD USING THE DEPOSITION PROCESSING EQUIPMENT

(71) Applicant: Samsung Display Co., LTD., Yongin-si (KR)

(72) Inventor: Junyoung Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 123 days.

(21) Appl. No.: 17/196,386

(22) Filed: Mar. 9, 2021

(65) Prior Publication Data

US 2021/0371971 A1 Dec. 2, 2021

(30) Foreign Application Priority Data

Jun. 1, 2020 (KR) .......................... 10-2020-0065834

(51) Int. Cl.
*C23C 14/34* (2006.01)
*C23C 14/04* (2006.01)
*C23C 14/50* (2006.01)

(52) U.S. Cl.
CPC ........ *C23C 14/3464* (2013.01); *C23C 14/042* (2013.01); *C23C 14/505* (2013.01)

(58) Field of Classification Search
CPC ......... H01L 21/67754; H01L 21/67757; H01L 21/67326; H01L 21/67313
See application file for complete search history.

(56) References Cited

U.S. PATENT DOCUMENTS

| 3,315,637 A | * | 4/1967 | Taylor | ..................... C23C 14/50 118/503 |
| 2013/0164437 A1 | * | 6/2013 | Yamazaki | .............. H05B 33/10 118/500 |
| 2020/0043696 A1 | | 2/2020 | Song | |
| 2021/0335585 A1 | * | 10/2021 | Cord | ..................... C23C 14/568 |

FOREIGN PATENT DOCUMENTS

| KR | 10-2015-0086255 | 7/2015 |
| KR | 10-1760667 | 7/2017 |
| KR | 10-2020-0015166 | 2/2020 |

* cited by examiner

*Primary Examiner* — Charles Capozzi
(74) *Attorney, Agent, or Firm* — KILE PARK REED & HOUTTEMAN PLLC (57) ABSTRACT

A substrate fixing device includes a first supporter supporting at least one substrate and a second supporter connected to the first supporter, making contact with a first surface and a second surface of the at least one substrate in a first direction, and vertically fixing the at least one substrate such that a third surface faces a normal line direction of the first supporter. The second supporter defines a deposition surface including the third surface, a portion of the first surface adjacent to the third surface, and a portion of the second surface adjacent to the third surface in the at least one substrate and exposes the defined deposition surface to the deposition processing space. A deposition processing equipment including the substrate fixing device and a deposition processing method using the deposition processing equipment are also provided.

12 Claims, 9 Drawing Sheets

SUBSTRATE FIXING DEVICE, DEPOSITION PROCESSING EQUIPMENT INCLUDING THE SAME, AND DEPOSITION PROCESSING METHOD USING THE DEPOSITION PROCESSING EQUIPMENT

CROSS-REFERENCE TO RELATED APPLICATION(S)

This application claims priority to and benefits of Korean Patent Application No. 10-2020-0065834 under 35 U.S.C. § 119, filed on Jun. 1, 2020 in the Korean Intellectual Property Office, the entire contents of which are incorporated herein by reference.

BACKGROUND

1. Technical Field

The disclosure relates to a substrate fixing device capable of improving a mass productivity of three-side deposition, a deposition processing equipment including the substrate fixing device, and a deposition processing method using the deposition processing equipment.

2. Description of the Related Art

Various types of substrates are being used in manufacturing processes of display substrates, and in recent years, deposition equipment that performs a variety of organic and/or inorganic depositions on a variety of substrates are also being diversified. Accordingly, there is a growing need for cost-effective deposition processing equipment that is able to perform a multi-side deposition as well as one-side deposition and to process multiple substrates at a time.

SUMMARY

The disclosure provides a substrate fixing device implemented to perform a three-side deposition on multiple substrates.

The disclosure provides a deposition processing equipment including the substrate fixing device implemented to perform a three-side deposition on multiple substrates and improving a mass productivity through multiple chambers.

The disclosure provides a deposition processing method using the deposition processing equipment.

Embodiments of the inventive concept provide a deposition processing equipment that may include a first chamber into which a substrate fixing device is loaded, wherein at least one substrate is loaded on the substrate fixing device and includes a first surface, a second surface opposite to the first surface, and a third surface that is a side surface between the first surface and the second surface. The deposition processing equipment may include a second chamber defining a deposition processing space in which a deposition process is performed on the at least one substrate loaded on the substrate fixing device, and a third chamber including a transfer module that transfers the substrate fixing device from the first chamber to the second chamber. The substrate fixing device may include a first supporter supporting the at least one substrate and a second supporter connected to the first supporter, making contact with the first surface and the second surface of the at least one substrate in a first direction, and vertically fixing the at least one substrate such that the third surface faces a normal line direction of the first supporter. The second supporter may define a deposition surface in the at least one substrate and exposes the defined deposition surface to the deposition processing space. The deposition surface may include the third surface, a portion of the first surface adjacent to the third surface, and a portion of the second surface adjacent to the third surface.

The second chamber may include a deposition source that emits a deposition material deposited on the at least one substrate, and the deposition source may be disposed to face the third surface.

The second chamber may include a fixing module that moves the deposition source in a direction closer to or farther away from the at least one substrate.

The first supporter may include a base member, a first support member disposed on the base member, defining a space into which the transfer module is inserted with the base member, and supporting the at least one substrate, and a connection member connecting the base member, the first support member, and the second supporter to each other.

The second supporter may be connected to the connection member to move in a direction closer to or farther away from the first supporter.

An area of the deposition surface in case that the second supporter moves in the direction farther away from the first supporter may be greater than an area of the deposition surface in case that the second supporter moves in the direction closer to the first supporter.

The second supporter may include fixing members that contact the first surface and the second surface of the at least one substrate, and a second support member connecting the fixing members to each other and to the first supporter.

The fixing members may not overlap the portion of the first surface in the first direction and the portion of the second surface in the first direction.

The fixing members may be connected to the second support member such that the fixing members move in a direction to be closer to each other or to be farther away from each other.

The substrate fixing device may further include a cushion member disposed on the first supporter to support the at least one substrate.

Embodiments of the inventive concept provide a substrate fixing device that may include a first supporter supporting at least one substrate including a first surface, a second surface opposite to the first surface, and a third surface that is a side surface between the first surface and the second surface, and a second supporter connected to the first supporter, making contact with the first surface and the second surface of the at least one substrate in a first direction, and vertically fixing the substrate such that the third surface faces a normal line direction of the first supporter. The second supporter may define a deposition surface and may expose the defined deposition surface to a deposition processing space. The deposition surface may include the third surface, a portion of the first surface adjacent to the third surface, and a portion of the second surface adjacent to the third surface.

The second supporter may include fixing members that contact the first surface and the second surface of the at least one substrate. The fixing members may not overlap the portion of the first surface in the first direction and the portion of the second surface in the first direction.

The second supporter may be connected to the first supporter to move in a direction closer to or farther away from the first supporter.

Embodiments of the inventive concept provide a deposition processing method. The method may include preparing at least one substrate including a first surface, a second surface opposite to the first surface, and a third surface that is a side surface between the first surface and the second surface, loading the at least one substrate into a substrate fixing device including a first supporter supporting the at least one substrate and a second supporter connected to the first supporter and vertically fixing the at least one substrate, loading the substrate fixing device into which the at least one substrate is loaded into a first chamber of a deposition processing equipment from an outside, transferring the substrate fixing device from the first chamber into a second chamber in which a deposition processing space is defined using a transfer module disposed in a third chamber, and performing a deposition process on the at least one substrate in the second chamber. The performing of the deposition process may include allowing the second supporter to define a deposition surface in the at least one substrate, the deposition surface including the third surface, a portion of the first surface adjacent to the third surface, and a portion of the second surface adjacent to the third surface, and exposing the defined deposition surface to the deposition processing space.

The performing of the deposition process may include sputtering a deposition material using a deposition source that moves in a direction closer to or farther away from the at least one substrate.

The first supporter may include a base member, a first support member disposed on the base member, defining a space into which the transfer module is inserted with the base member, and supporting the at least one substrate, and a connection member connecting the base member, the first support member, and the second supporter to each other.

The second supporter may move in a direction closer to or farther away from the first supporter.

The second supporter may include fixing members that contact the first surface and the second surface of the at least one substrate, and a second support member connecting the fixing members to each other and to the first supporter.

The fixing members may not overlap the portion of the first surface in a first direction and the portion of the second surface in the first direction.

The fixing members may be connected to the second support member such that the fixing members move in a direction to be closer to each other or to be farther away from each other in a first direction.

According to the above, large quantities of the substrate may be loaded at a time using a specially-manufactured substrate fixing device, and a process time may be reduced using the multiple chambers. Deposition on three sides of a substrate at a time may be possible, and thus a material cost may be reduced. Accordingly, the mass productivity may be improved by the deposition processing equipment and the deposition processing method.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

In the disclosure, it will be understood that when an element or layer is referred to as being "on", "connected to" or "coupled to" another element or layer, it can be directly on, connected to, or coupled to the other element or layer, or one or more intervening elements or layers may be present.

Like numerals refer to like elements throughout the specification. In the drawings, the thickness, ratio, and dimension of components may be exaggerated for effective description of the technical content.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as shown in the figures.

It will be further understood that terms such as "comprises," "comprising," "includes," "including," "have," "having," "contains," and/or "containing" when used in this specification, specify the presence of stated features, integers, steps, operations, elements, and/or components, but do not preclude the presence or addition of one or more other features, integers, steps, operations, elements, components, and/or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to accompanying drawings.

Figure 1A:
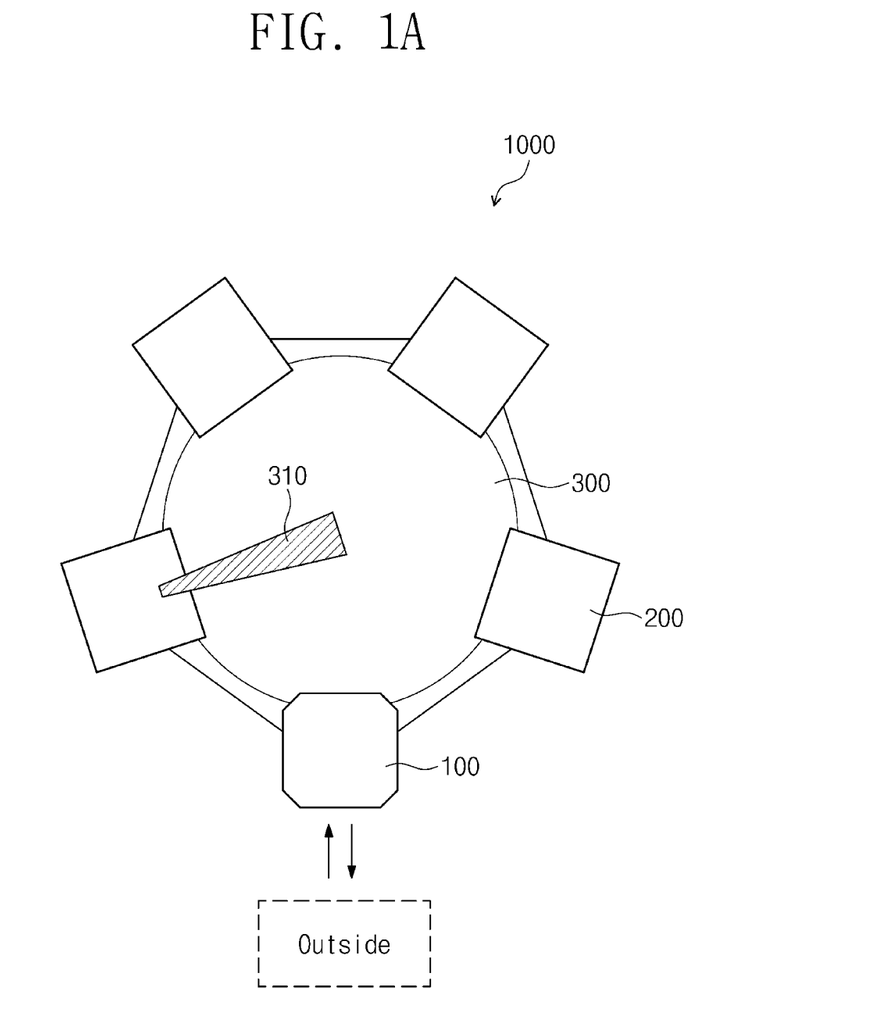
FIGS. 1A and 1B are schematic views showing a deposition processing equipment according to an embodiment of the disclosure.
Figure 1B:
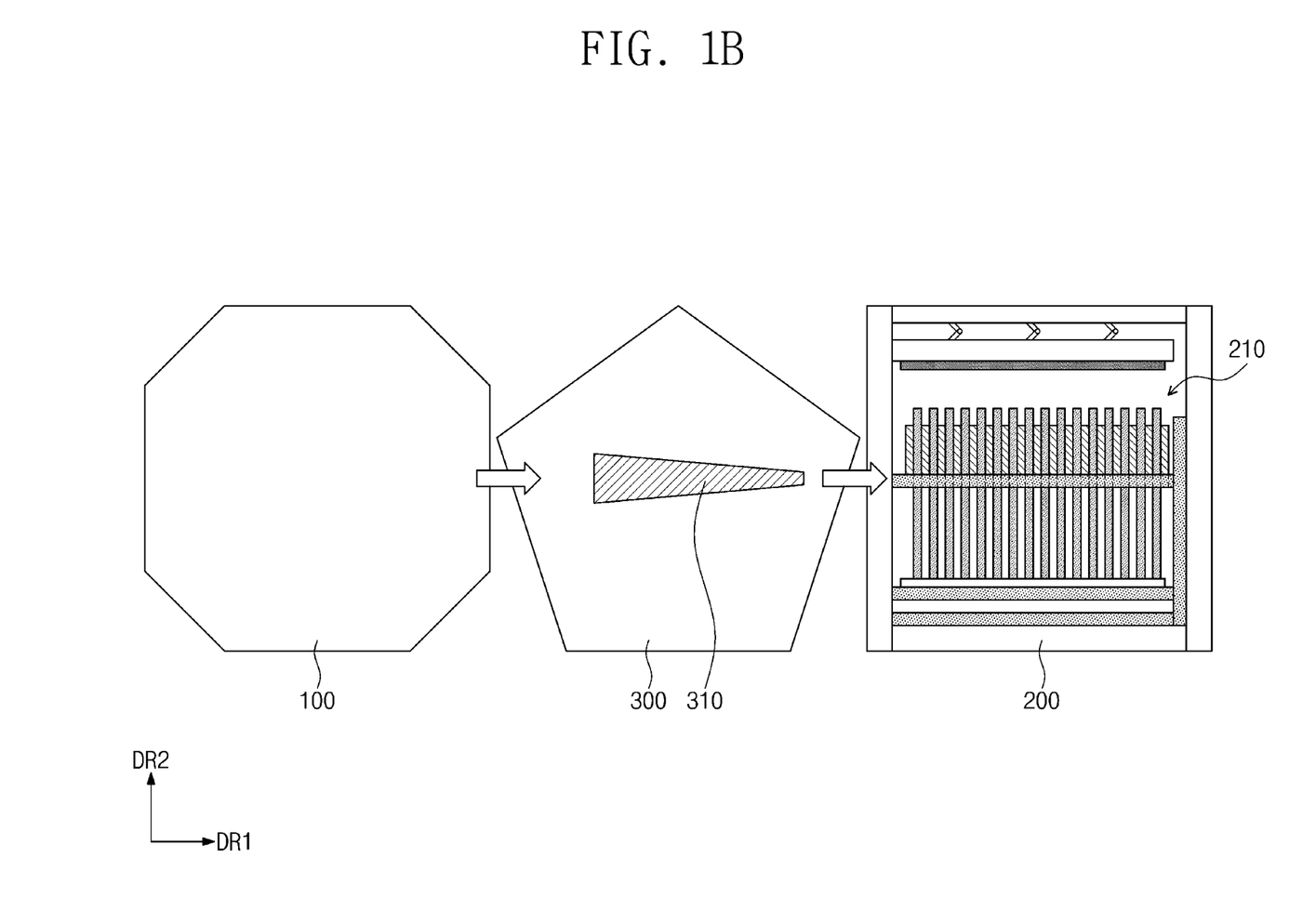

FIGS. 1A and 1B are schematic views showing a deposition processing equipment 1000 according to an embodiment of the disclosure.

FIG. 1A shows the deposition processing equipment 1000 that includes second chambers according to an embodiment of the disclosure. FIG. 1B shows the deposition processing equipment 1000.

Referring to FIG. 1A, the deposition processing equipment 1000 may include a first chamber 100, a second chamber 200, and a third chamber 300. The second chamber 200 of the deposition processing equipment 1000 may be provided in plural. Four second chambers 200 are shown in the figure. However, the number of the second chambers 200 should not be limited thereto or thereby. The number of the second chambers 200 included in the deposition processing equipment 1000 may be greater than or less than four. According to an embodiment, the first chamber 100 of the deposition processing equipment 1000 may be provided in plural.

The first chamber 100 may load at least one substrate into the equipment from an outside and may unload the at least one substrate to the outside after a deposition process is completed. The first chamber 100 may load or unload the at least one substrate. The first chamber 100 may load or unload the at least one substrate in the unit of one substrate fixing device that may include multiple substrates. The first chamber 100 may be provided in plural to load the substrate into the equipment in a vacuum state from the outside. Although not shown in figures, the loading and unloading the substrate in the first chamber 100 may be performed by a dedicated robot arm.

The second chamber 200 may define a space in which the deposition processing operation required for the substrate is performed in the vacuum state. The second chamber 200 may be provided in plural. Accordingly, various types of layers may be deposited on the substrate in one deposition processing equipment, and a process time may be reduced. The deposition processing equipment according to the embodiment may be provided in a multi-type system that includes the plural second chambers 200. Accordingly, the chambers may be managed separately from each other, a process management may be easy, and a process reliability may be improved.

The third chamber 300 may transfer the substrate fixing device including at least one substrate loaded from the first chamber 100 into the second chamber 200 in which a deposition processing space is defined. The third chamber 300 may include a transfer module 310 corresponding to a robot arm that transfers the substrate fixing device. The transfer module 310 may transfer not only the substrate fixing device from the first chamber 100 to the second chamber 200, but also the substrates processed in the second chamber 200 to another second chamber 200 or the first chamber 100.

The third chamber 300 including the transfer module 310 may be disposed at a center in the deposition processing equipment 1000 according to the embodiment, and the first chamber 100 and the second chambers 200 may be arranged at positions corresponding to an edge of a circular shape in a cluster type.

In FIG. 1B, the substrate fixing device 210 loaded into the first chamber 100 may be transferred to the second chamber 200 by the transfer module 310 of the third chamber 300. FIG. 1B shows the deposition processing equipment 1000 that includes the substrate fixing device 210 disposed in the second chamber 200. The substrate fixing device 210 transferred to one second chamber 200 among the second chambers 200 may provide the at least one substrate loaded thereon to the deposition processing space in the second chamber 200.

Figure 2:
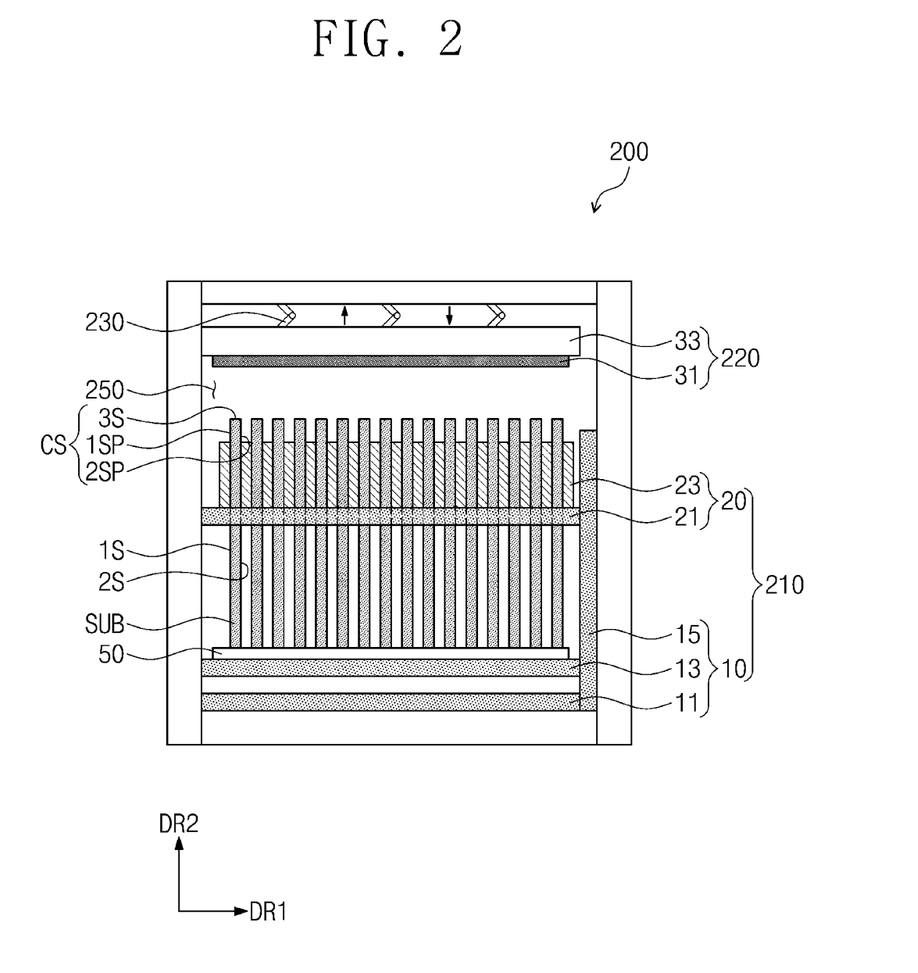
FIG. 2 is a schematic view showing a second chamber according to an embodiment of the disclosure.

FIG. 2 is a schematic view showing the second chamber 200 according to an embodiment of the disclosure. FIG. 2 shows the second chamber 200 that includes the substrate fixing device 210.

Referring to FIG. 2, the second chamber 200 may include the substrate fixing device 210, a deposition source 220, and a fixing module 230. In FIG. 2, the deposition processing space 250 may be defined in the second chamber 200. The deposition processing space 250 may correspond to a space or an area in which a deposition material emitted from the deposition source 220 is deposited on the substrates SUB fixed to the substrate fixing device 210.

The substrate fixing device 210 may include at least one substrate SUB, a first supporter 10, and a second supporter 20. The first supporter 10 and the second supporter 20 may allow the at least one substrate SUB to be vertically placed in the substrate fixing device 210. The at least one substrate SUB may be disposed on the first supporter 10 and may be vertically fixed by the second supporter 20.

The at least one substrate SUB may include a first surface 1S, a second surface 2S, and a third surface 3S. The first surface 1S and the second surface 2S may be defined as opposite surfaces to each other, and the third surface 3S may be defined as a side surface connecting the first surface 1S and the second surface 2S. The at least one substrate SUB may be vertically placed such that the third surface 3S faces a normal line direction of the first supporter 10.

According to the embodiment, the substrate fixing device 210 may include a cushion member 50 disposed on the first supporter 10 to support the at least one substrate SUB. The cushion member 50 may be disposed under the at least one substrate SUB and may protect the at least one substrate SUB from impacts.

The deposition source 220 may emit the deposition material needed for the at least one substrate. The deposition source 220 may be disposed to face the at least one substrate SUB. The deposition source 220 may include a target 31 and a deposition module 33. The target 31 may be a plate containing the deposition material. One surface of the target 31 may face the third surface 3S of the at least one substrate SUB. The target 31 may include a deposition material required according to the type of deposition process performed in the second chamber 200. The other surface of the target 31 may contact the deposition module 33. The deposition module 33 may sputter the deposition material to the at least one substrate SUB from the target 31 that is in contact therewith.

The fixing module 230 may fix the deposition source 220 to the second chamber 200. The fixing module 230 may be a robot arm whose length is variably adjusted. The fixing module 230 may move the deposition source 220 in a direction closer to or farther away from the at least one substrate SUB. For example, when the length of the fixing module 230 increases, the deposition source 220 becomes closer to the at least one substrate SUB that is a deposition object, and when the length of the fixing module 230 decreases, the deposition source 220 becomes farther away from the at least one substrate SUB. Accordingly, limits in size and in length in the second direction DR2 of the at least one substrate SUB loaded into the second chamber 200 may be reduced.

Figure 3:
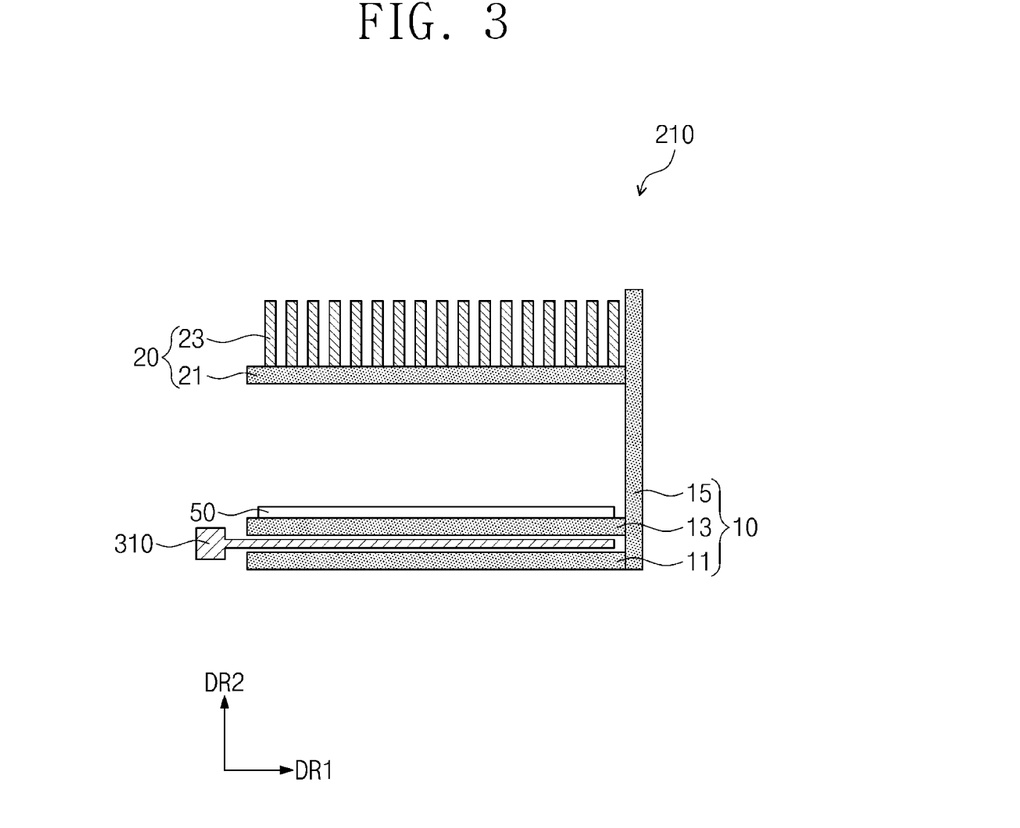
FIG. 3 is a schematic view showing a substrate fixing device according to an embodiment of the disclosure.
Figure 4A:
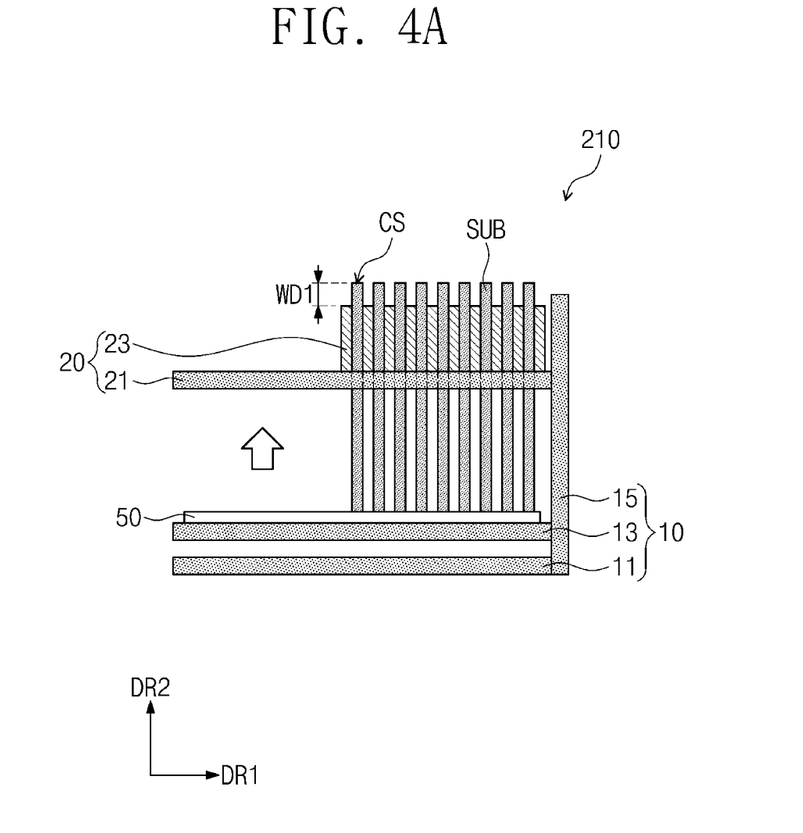
FIGS. 4A and 4B are schematic views showing a substrate fixing device according to an embodiment of the disclosure.
Figure 4B:
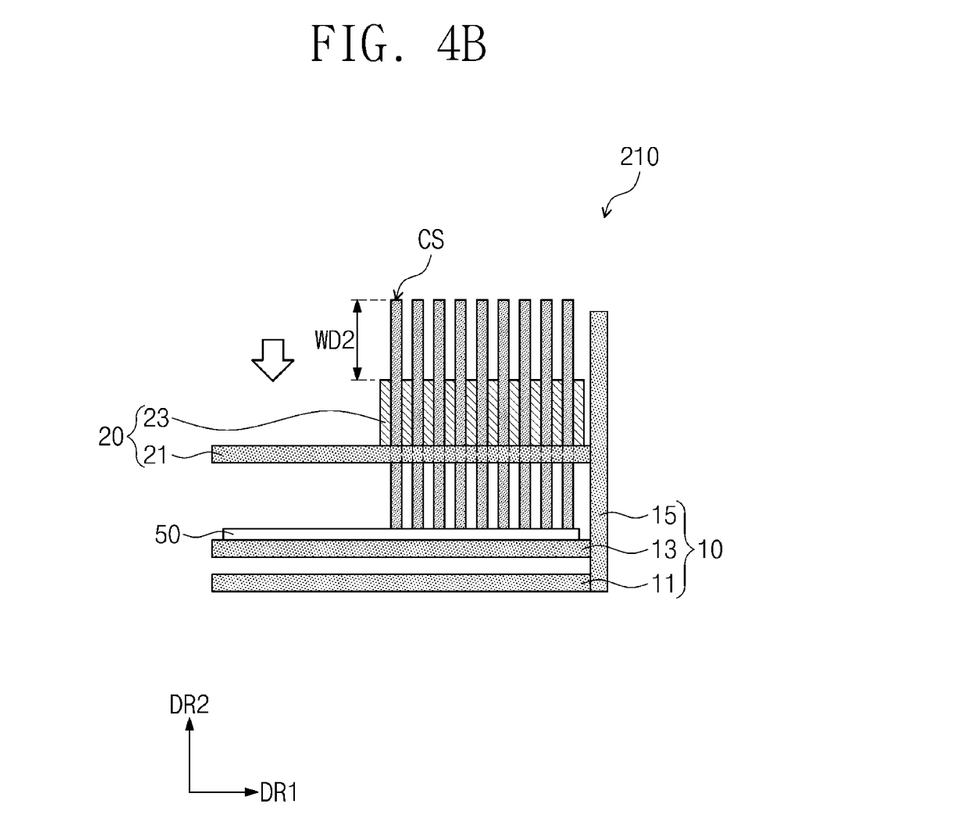

FIG. 3 is a schematic view showing the substrate fixing device 210 according to an embodiment of the disclosure. FIGS. 4A and 4B are schematic views showing the substrate fixing device according to an embodiment of the disclosure.

Referring to FIGS. 3, 4A, and 4B, the substrate fixing device 210 may include the first supporter 10 and the second supporter 20. The first supporter 10 may include a base member 11, a first support member 13, and a connection member 15. The second supporter 20 may include a second support member 21 and fixing members 23.

The first supporter 10 may support the at least one substrate SUB. The second supporter 20 may vertically fix the at least one substrate SUB. The first supporter 10 may support a surface opposite to the third surface 3S (refer to FIG. 2) of the at least one substrate SUB. The second supporter 20 may be connected to the first supporter 10 and may support the first surface 1S and the second surface 2S of the at least one substrate SUB in the first direction DR1, and thus may fix the at least one substrate SUB such that the third surface 3S faces the second direction DR2.

The second supporter 20 may define a deposition surface CS on the at least one substrate SUB. Referring to FIG. 2, the deposition surface CS may include three surfaces, such as the third surface 3S, a portion 1SP of the first surface 1s adjacent to the third surface 3S, and a portion 2SP of the second surface 2S adjacent to the third surface 3S. For example, the fixing members 23 may not overlap the portion 1SP of the first surface 1s in the second direction and the fixing members 23 may not overlap the portion 2SP of the second surface 2S in the second direction. The deposition surface CS may be defined in a side surface portion of the at least one substrate SUB. The deposition surface CS defined by the second supporter 20 may be exposed to the deposition processing space 250 (refer to FIG. 2) defined in the second chamber 200. The deposition surface CS may be a surface of the at least one substrate SUB that is exposed to the deposition processing space 250 and not covered by the second supporter 20.

The base member 11 of the first supporter 10 may be seated on the second chamber 200. The first support member 13 may be disposed above the base member 11. The first support member 13 and the base member 11 may define a space therebetween into which the transfer module 310 is inserted. The first support member 13 may support the at least one substrate SUB. The connection member 15 may connect the base member 11 and the support member 13. The connection member 15 may extend in the second direction DR2 and may be coupled to a side surface of the base member 11 and a side surface of the first support member 13 each extending in the first direction DR1. The connection member 15 may connect the first supporter 10 to the second supporter 20. The connection member 15 extending in the second direction DR2 may be coupled to a side surface of the second support member 21.

The fixing members 23 may be coupled to the second support member 21. The fixing members 23 may extend in the second direction DR2 and may be arranged along the first direction DR1 in which the second support member 21 extends. The at least one substrate SUB may be disposed between the fixing members 23. The fixing members 23 may contact the first surface 1S and the second surface 2S of the at least one substrate SUB. The fixing members 23 may not contact the deposition surface of the at least one substrate SUB. The fixing members 23 may contact another portion of the first surface and another portion of the second surface except the third surface 3S of the at least one substrate SUB, the portion 1SP of the first surface adjacent to the third surface 3S, and the portion of the second surface adjacent to the third surface 3S, and thus may vertically fix the at least one substrate SUB in the second direction DR2.

FIG. 4A shows a state in which the second supporter 20 moves in a direction away from the first supporter 10, and FIG. 4B shows a state in which the second supporter 20 moves in a direction closer to the first supporter 10.

In FIGS. 4A and 4B, the second supporter 20 may be coupled to the connection member 15 to be able to move in a direction away from or closer to the first supporter 10. The second support member 21 may move in the second direction DR2. The fixing members 23 coupled to the second support member 21 may move as the second support member 21 moves. The fixing members 23 may define the deposition surface CS on the at least one substrate that is in contact with each fixing member. In case that the fixing members 23 move in the direction closer to the first supporter 10, an area of the deposition surface CS may gradually increase. In case that the fixing members 23 move in the direction away from the first supporter 10, the area of the deposition surface CS may gradually decrease. An area WD1 of the deposition surface CS in FIG. 4A may be smaller than an area WD2 of the deposition surface CS in FIG. 4B.

Figure 5:
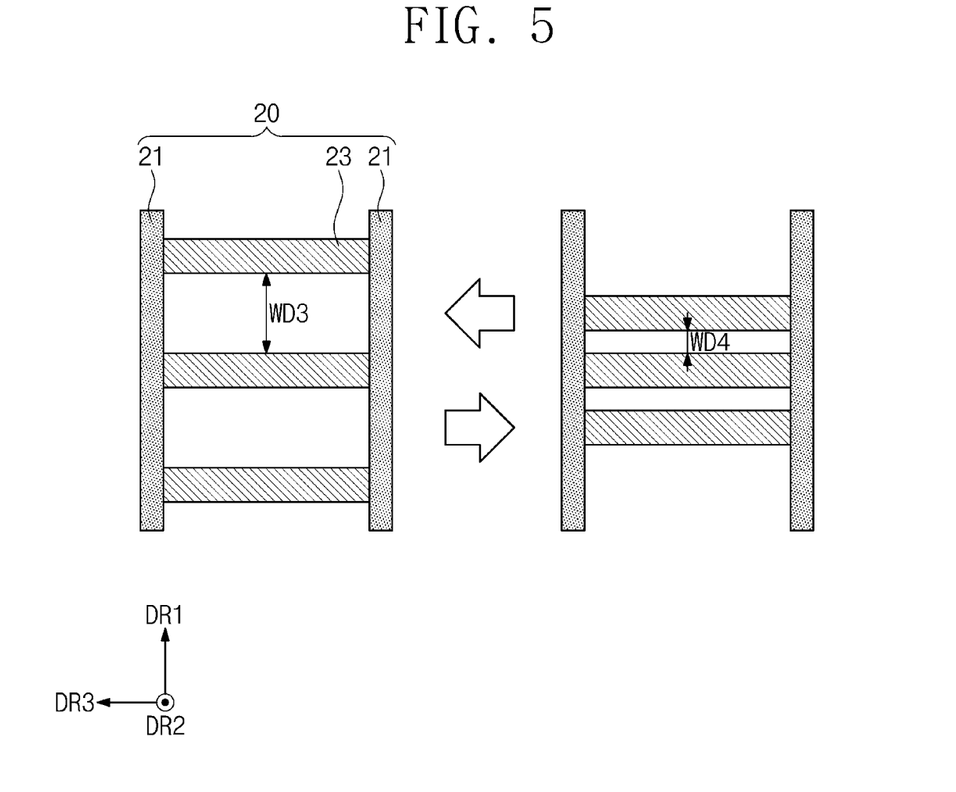
FIG. 5 is a schematic view showing a second supporter according to an embodiment of the disclosure.

FIG. 5 is a schematic view showing the second supporter 20 according to an embodiment of the disclosure.

Referring to FIG. 5, the second supporter 20 may include two second support members 21 and the fixing members 23.

The fixing members 23 may be coupled to the second support members 21 disposed at opposite sides of the fixing members 23. The fixing members 23 may be coupled to the second support members 21 at opposite sides thereof so as to be movable by the second supporting members 21. For example, the fixing members 23 may move in directions to be closer to each other or to be farther away from each other. Accordingly, widths between the fixing members 23 may have a width WD3 when the fixing members 23 move away from each other and a width WD4 when the fixing members 23 are close to each other. Thus, the second supporter 20 may fix substrates of various thicknesses or sizes regardless of the thickness of the at least one substrate SUB.

Figure 6A:
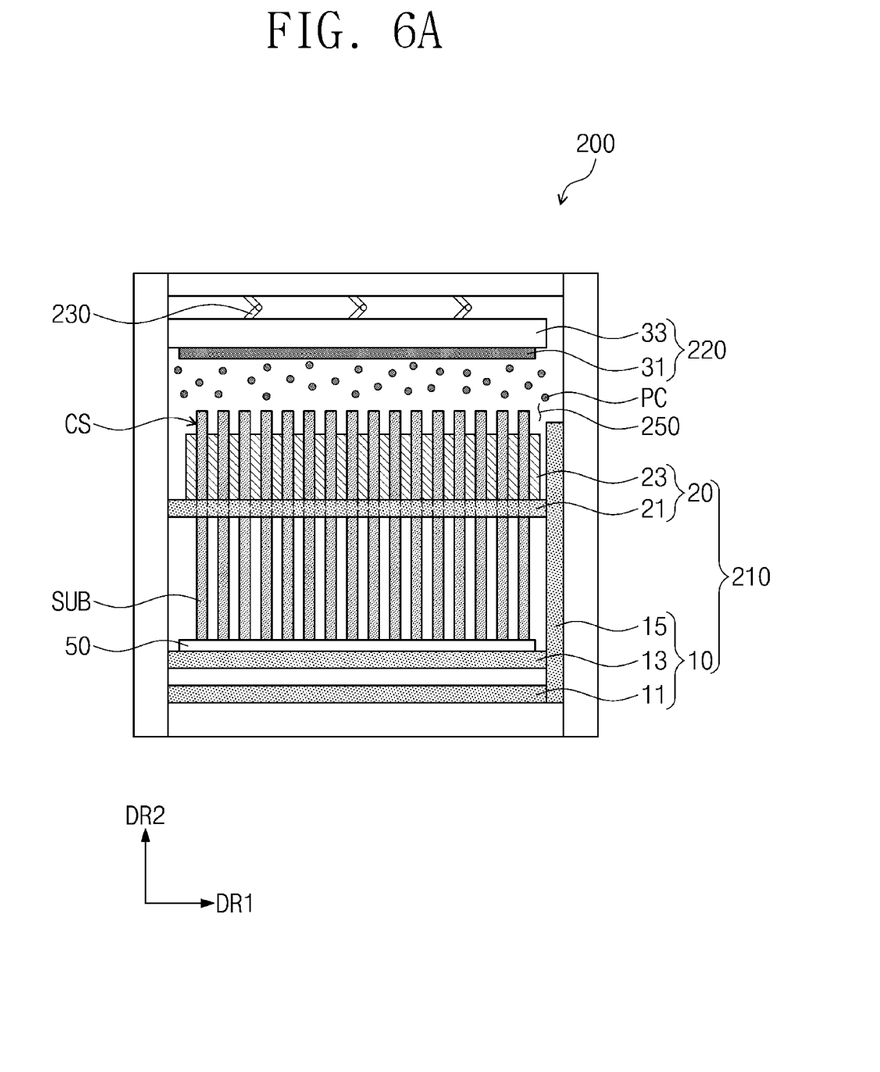
FIGS. 6A and 6B are schematic views showing a deposition processing method according to an embodiment of the disclosure.
Figure 6B:
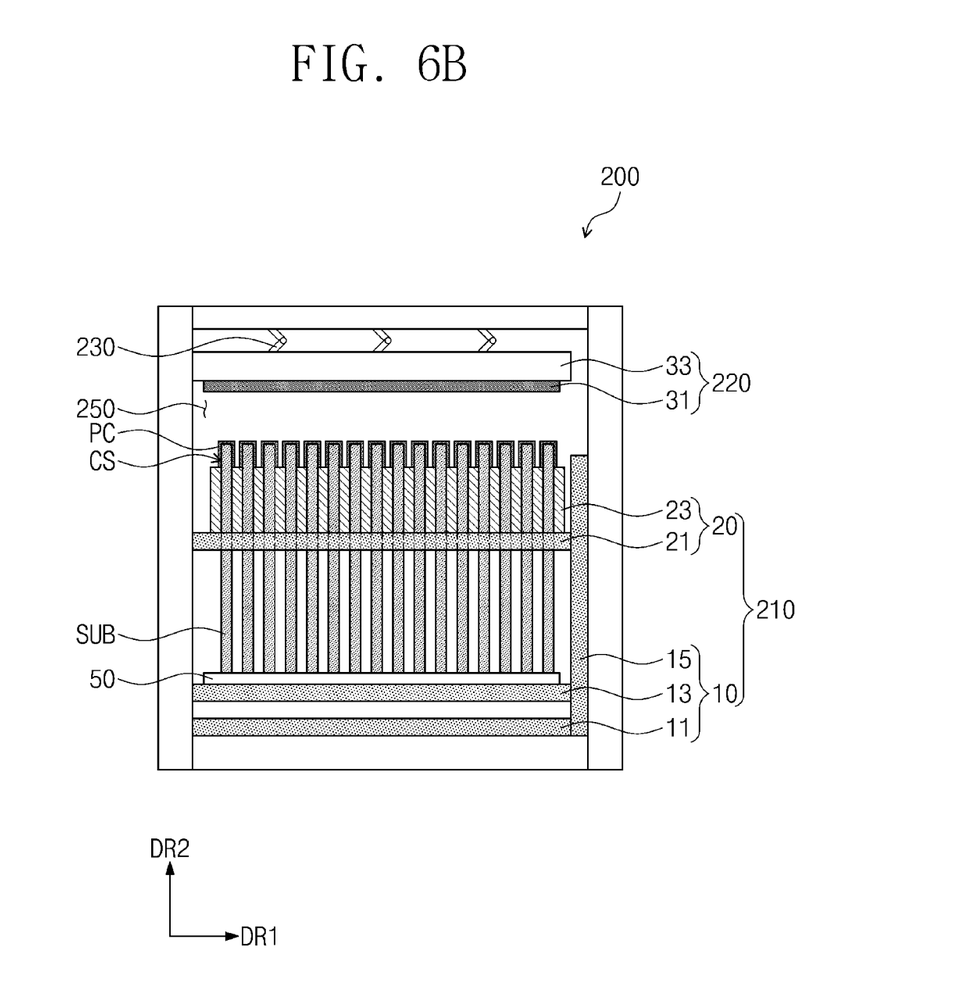

FIGS. 6A and 6B are schematic views showing a deposition processing method according to an embodiment of the disclosure.

FIG. 6A shows deposition materials PC sputtered from the deposition source 220 onto the deposition surface CS of the at least one substrate SUB that is loaded into the substrate fixing device 210, and FIG. 6B shows the deposition materials PC deposited on the deposition surface CS of the at least one substrate SUB.

Referring to FIGS. 6A and 6B, the deposition processing method may include preparing the at least one substrate SUB, loading the at least one substrate SUB on the substrate fixing device 210, loading the substrate fixing device 210 on which the at least one substrate SUB is loaded into the first chamber 100 from the outside, transferring the substrate fixing device 210 to the second chamber 200, and performing the deposition process.

In the preparing of the substrate, the at least one substrate SUB that includes the first surface 1S (refer to FIG. 2), the second surface 2S (refer to FIG. 2) opposite to the first surface 1S, and the third surface 3S (refer to FIG. 2) between the first surface 1S and the second surface 2S is prepared.

In the loading of the substrate, the at least one substrate SUB may be loaded on the substrate fixing device 210 that includes the first supporter 10 supporting the at least one substrate SUB and the second supporter 20 connected to the first supporter 10, making contact with the first surface is and the second surface 2S of the at least one substrate SUB in the first direction, and vertically loading the at least one substrate SUB such that the third surface 3S faces the normal line direction of the first supporter 10.

In the loading operation, the substrate fixing device 210 may be loaded into the first chamber 100.

In the transferring operation, the substrate fixing device 210 loaded into the first chamber 100 may be transferred to the second chamber 200 by the transfer module 310 of the third chamber 300.

In the performing of the deposition process, the deposition process may be performed on the at least one substrate SUB in the deposition processing space 250 defined in the second chamber 200.

In the embodiment, the performing of the deposition process may include exposing the deposition surface CS defined in the at least one substrate SUB to the deposition processing space 250 by the substrate fixing device 210. The deposition surface CS may be defined by the second supporter 20 of the substrate fixing device 210. The fixing members 23 of the second supporter 20 may contact the first surface and the second surface of the at least one substrate to mask the contact portions, and the portion 1SP of the first surface 1S, the portion 2SP of the second surface 2S, and the third surface 3S of the at least one substrate SUB, which may not contact the fixing members 23, may be exposed to the deposition processing space 250. Accordingly, the surface exposed to the deposition processing space 250 without making contact with the fixing members 23 may be defined as the deposition surface CS.

In the embodiment, the performing of the deposition process may include sputtering the deposition materials PC to the exposed deposition surface from the deposition source 220. The deposition materials PC sputtered from the deposition source 220 may be deposited onto the deposition surface CS of the at least one substrate SUB. Hereinafter, in describing the deposition processing method, details on the same elements as the deposition processing equipment in FIGS. 1 to 5 will be omitted.

The substrate fixing device according to embodiments of the disclosure may be designed to be suitable for the loading of large quantities of substrates at a time and a three-side deposition, and thus, three sides including the side surface of the at least one substrate may be exposed to the deposition processing space. The deposition processing method performed by the deposition processing equipment including the substrate fixing device may reduce a process time. Accordingly, a material cost may be reduced, and thus, the mass productivity may be improved.

Although the embodiments of the disclosure have been described, it is understood that the disclosure should not be limited to these embodiments but various changes and modifications can be made by one ordinary skilled in the art within the spirit and scope of the disclosure as hereinafter claimed. Therefore, the disclosed subject matter should not be limited to any single embodiment described herein, and the scope of the inventive concept shall be determined according to the attached claims.

What is claimed is:

1. A deposition processing equipment comprising:
a first chamber into which a substrate fixing device is loaded, wherein at least one substrate is loaded on the substrate fixing device and comprises:
a first surface;
a second surface opposite to the first surface; and
a third surface that is a side surface between the first surface and the second surface;
a second chamber defining a deposition processing space in which a deposition process is performed on the at least one substrate loaded on the substrate fixing device; and
a third chamber comprising a transfer module that transfers the substrate fixing device from the first chamber to the second chamber, the substrate fixing device comprising:
a first supporter supporting the at least one substrate; and
a second supporter connected to the first supporter, making contact with the first surface and the second surface of the at least one substrate in a first direction, and vertically fixing the at least one substrate such that the third surface faces a normal line direction of the first supporter, wherein
the second supporter defines a deposition surface in the at least one substrate and exposes the defined deposition surface to the deposition processing space, and
the deposition surface comprises the third surface, a portion of the first surface adjacent to the third surface, and a portion of the second surface adjacent to the third surface,
wherein the first supporter comprise:
a base member;
a first support member disposed on the base member defining a space into which the transfer module is inserted with the base member, and supporting the at least one substrate; and
a connection member connecting the base member, the first support member, and the second supporter to each other.

2. The deposition processing equipment of claim 1, wherein
the second chamber comprises a deposition source that emits a deposition material deposited on the at least one substrate, and
the deposition source is disposed to face the third surface.

3. The deposition processing equipment of claim 2, wherein the second chamber comprises a fixing module that moves the deposition source in a direction closer to or farther away from the at least one substrate.

4. The deposition processing equipment of claim 1, wherein the second supporter is connected to the connection member to move in a direction closer to or farther away from the third surface.

5. The deposition processing equipment of claim 4, wherein an area of the deposition surface in case that the second supporter moves in the direction farther away from the third surface is greater than an area of the deposition surface in case that the second supporter moves in the direction closer to the third surface.

6. The deposition processing equipment of claim 1, wherein the second supporter comprises:
a plurality of fixing members that contact the first surface and the second surface of the at least one substrate; and
a second support member connecting the plurality of fixing members to each other and to the first supporter.

7. The deposition processing equipment of claim 6, wherein the plurality of fixing members do not overlap the portion of the first surface in the first direction and the portion of the second surface in the first direction.

8. The deposition processing equipment of claim 6, wherein the plurality of fixing members are connected to the second support member such that the plurality of fixing members move in a direction to be closer to each other or to be farther away from each other.

9. The deposition processing equipment of claim 1, wherein the substrate fixing device further comprises a cushion member disposed on the first supporter to support the at least one substrate, the cushion member supporting and in contact with a side surface of the at least one substrate that is opposite the third surface.

10. A substrate fixing device comprising:
a first supporter supporting at least one substrate comprising a first surface, a second surface opposite to the first surface, and a third surface that is a side surface between the first surface and the second surface; and
a second supporter connected to the first supporter, making contact with the first surface and the second surface of the at least one substrate in a first direction, and vertically fixing the at least one substrate such that the third surface faces a normal line direction of the first supporter, wherein
the second supporter defines a deposition surface in the at least one substrate and exposes the defined deposition surface to a deposition processing space, and
the deposition surface comprises the third surface, a portion of the first surface adjacent to the third surface, and a portion of the second surface adjacent to the third surface,
wherein the first supporter comprises:
a base member;
a first support member disposed on the base member, defining a space with the base member, and supporting the at least one substrate; and
a connection member connecting the base member, the first support member and the second supporter to each other.

11. The substrate fixing device of claim 10, wherein
the second supporter comprises a plurality of fixing members that contact the first surface and the second surface of the at least one substrate, and
the plurality of fixing members do not overlap the portion of the first surface in the first direction and the portion of the second surface in the first direction.

12. The substrate fixing device of claim 11, wherein the second supporter is connected to the first supporter to move in a direction closer to or farther away from the third surface.

* * * * *